United States Patent
Park

(10) Patent No.: US 8,094,142 B2
(45) Date of Patent: Jan. 10, 2012

(54) DISPLAY DEVICE

(75) Inventor: Haeng-Won Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1219 days.

(21) Appl. No.: 11/188,009

(22) Filed: Jul. 25, 2005

(65) Prior Publication Data

US 2006/0017686 A1 Jan. 26, 2006

(30) Foreign Application Priority Data

Jul. 26, 2004 (KR) .................. 10-2004-0058252

(51) Int. Cl.
*G06F 3/038* (2006.01)
(52) U.S. Cl. .......................................... 345/204; 345/87
(58) Field of Classification Search .................. 345/204, 345/98–100
See application file for complete search history.

(56) References Cited

U.S. PATENT DOCUMENTS

| | | | |
|---|---|---|---|
| 6,380,920 B1 | 4/2002 | Ozawa | |
| 2001/0050678 A1* | 12/2001 | Nishikubo et al. | 345/204 |
| 2004/0189585 A1* | 9/2004 | Moon | 345/100 |

FOREIGN PATENT DOCUMENTS

| | | |
|---|---|---|
| CN | 1444196 | 9/2003 |
| CN | 1471068 | 1/2004 |
| JP | 2000-163018 A | 6/2000 |
| JP | 2002-287711 | 4/2002 |
| JP | 2003-345457 | 5/2003 |
| JP | 2004-17132 | 6/2004 |
| JP | 2004-171732 | 6/2004 |
| KR | 10-2004-0061210 A | 7/2004 |

* cited by examiner

*Primary Examiner* — Nitin Patel
(74) *Attorney, Agent, or Firm* — Innovation Counsel LLP

(57) ABSTRACT

A display device includes pixels, each including a switching element; a shift register comprising stages coupled with the switching elements and sequentially generating output signals; clock signal lines transmitting clock signals; at least a control signal line transmitting a control signal; and terminal lines connecting the clock signal lines and the control signal with the stages, wherein the terminal lines comprise at least one common terminal line commonly connected with at least two stages.

58 Claims, 6 Drawing Sheets

DISPLAY DEVICE

CROSS REFERENCE TO RELATED APPLICATION

This application claims priority to and the benefit of Korean Patent Application No. 10-2004-0058252, filed on Jul. 26, 2004 which is hereby incorporated by reference for all purposes as if fully set forth herein.

BACKGROUND OF THE INVENTION

1. Field of the Invention

The present invention relates to a display device that is capable of reducing power consumption and implementing high resolution and a display on a large-sized screen.

2. Description of Related Art

The demand is increasing for flat panel displays, such as plasma display panels ("PDPs"), organic light emitting displays ("OLEDs"), and liquid crystal displays ("LCDs").

PDPs are devices that display characters or images using plasma generated by gas-discharge. OLEDs are devices which display characters or images by applying an electric field to specific light-emitting organic or high molecule materials. LCDs are devices which display images by applying an electric field to a liquid crystal layer disposed between two panels, and regulating the strength of the electric field to adjust a transmittance of light passing through the liquid crystal layer.

The flat panel displays, for example, the LCD and the OLED, each include a panel assembly provided with pixels including switching elements and display signal lines, and a gate driver, i.e., a shift register, providing a gate signal for gate lines of the display signal lines to turn the switching elements on and off.

The shift register includes a plurality of stages, each of which includes a plurality of transistors. Each stage includes an input unit, an output unit, and a discharge unit, and outputs the gate signal synchronized with a clock signal in response to gate outputs of previous and next stages.

The stages are applied with a gate-off voltage, a clock signal, etc., from signal lines extending parallel to each other in a longitudinal direction at one side of the stages. Terminal lines, which connect the signal lines to the stages, are required for applying the signals to the stages, and thus the terminal lines must overlap the remaining signal lines except for a signal line disposed closest to the stages. In particular, a terminal line connected to a signal line furthest from the stages overlaps several signal lines. This causes parasitic capacitances to increase, thereby increasing power consumption.

Additionally, transistors belonging to the output unit are required to be larger in order to generate a gate output suitable for a display device having high resolution and a large-sized screen.

SUMMARY OF THE INVENTION

The present invention provides a display device that is capable of reducing power consumption and implementing high resolution and a display on a large-sized screen.

Additional features of the invention will be set forth in the description which follows, and in part will be apparent from the description, or may be learned by practice of the invention The invention provides a device including pixels, each including a switching element, a shift register including stages coupled with the switching elements and sequentially generating output signals, clock signal lines transmitting clock signals, at least one control signal line transmitting a control signal, and terminal lines connecting the clock signal lines and the control signal line with the stages, wherein the terminal lines include at least one common terminal line commonly connected with at least two of the stages.

The invention further provides for a display device including a shift register including stages connected with each other, each of the stages sequentially generating output signals, wherein each of the stages includes a set terminal applied with a scanning start signal or an output signal from a previous stage, a reset terminal applied with an output signal received from any one of subsequent stages, a first clock terminal and a second clock terminal applied with a first clock signal and a second clock signal, respectively, a gate voltage terminal applied with a gate-off voltage, and at least one output terminal, wherein the gate voltage terminals belonging to two adjacent stages of the stages are substantially disposed symmetrically with respect to a border of the two adjacent stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
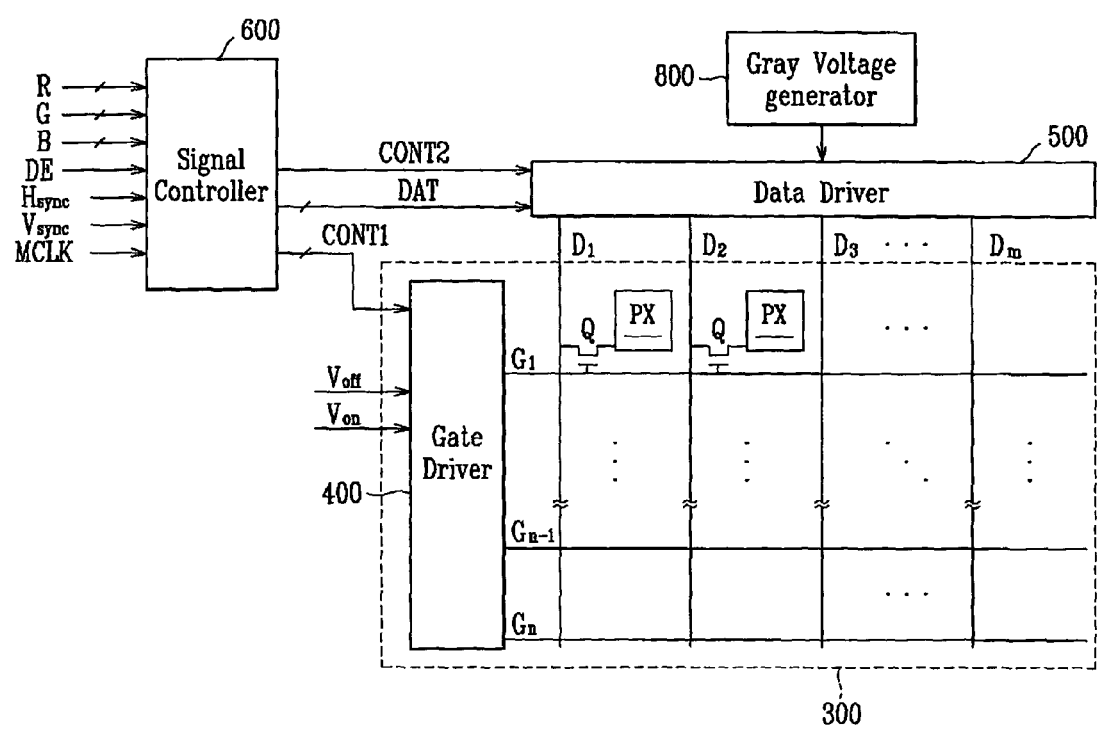
FIG. 1 is a block diagram of a display device according to an embodiment of the invention.

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

A display device and a manufacturing method thereof according to embodiments of the invention are described below with reference to the drawings.

Figure 2:
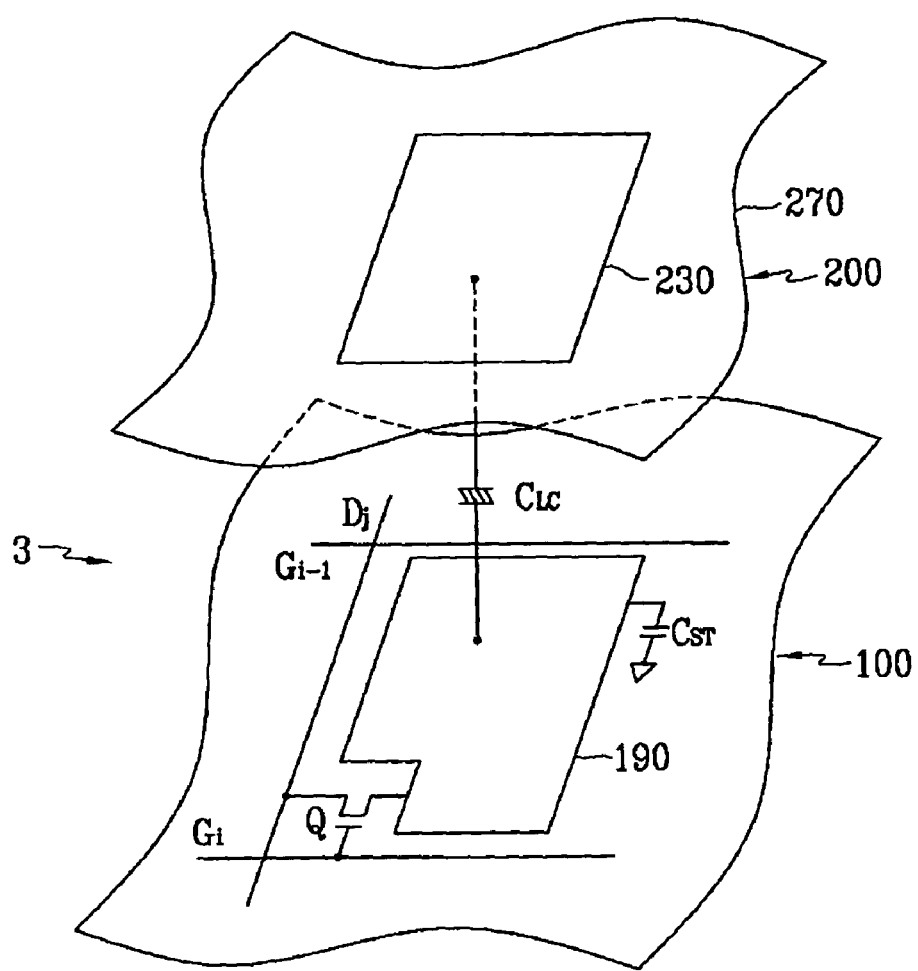
FIG. 2 illustrates a structure and an equivalent circuit diagram of a pixel of a liquid crystal display according to an embodiment of the invention.

FIG. 1 is a block diagram of a display device according to an embodiment of the invention, and FIG. 2 illustrates a structure and an equivalent circuit diagram of a pixel of an LCD according to an embodiment of the invention.

Referring to FIG. 1, a display device includes a panel assembly 300, a gate driver 400 with a data driver 500 connected thereto, a gray voltage generator 800 with the data driver 500, and a signal controller 600 that controls the above-described elements.

The panel assembly 300 includes a plurality of display signal lines $G_1$-$G_n$ and $D_1$-$D_m$, and a plurality of pixels connected with the display signal lines $G_1$-$G_n$ and $D_1$-$D_m$ and arranged substantially in a matrix structure. The panel assembly 300 includes a lower panel 100 and an upper panel 200, as shown in FIG. 2.

The display signal lines $G_1$-$G_n$ and $D_1$-$D_m$ are provided on the lower panel 100, and include gate lines $G_1$-$G_n$ transmitting gate signals (referred to as scanning signals) and data lines $D_1$-$D_m$ transmitting data signals. The gate lines $G_1$-$G_n$ extend substantially in a row direction and are substantially parallel with each other, and the data lines $D_1$-$D_m$ extend substantially in a column direction and are substantially parallel with each other. It is understood that the directions of the gate lines $G_1$-$G_n$ and $D_1$-$D_m$ may be reversed so that the $G_1$-$G_n$ extend in a column direction and the $D_1$-$D_m$ extend in a row direction.

Each pixel includes a switching element Q connected with one of the gate lines $G_1$-$G_n$ and one of the data lines $D_1$-$D_m$, and pixel circuits PX connected with the switching element Q. The switching element Q is provided on the lower panel 100 and has three terminals: a control terminal connected with one of the gate lines $G_1$-$G_n$, an input terminal connected with one of the data lines $D_1$-$D_m$, and an output terminal connected with the pixel circuit PX.

In active matrix type LCDs, for example, the panel assembly 300 includes the lower panel 100, the upper panel 200, a liquid crystal (LC) layer 3 provided between the lower and upper panels 100 and 200, and the display signal lines $G_1$-$G_n$ and $D_1$-$D_m$, and the switching elements Q are provided on the lower panel 100. Each pixel circuit PX includes an LC capacitor $C_{LC}$ and a storage capacitor $C_{ST}$ that are connected in parallel with the switching element Q. According to an embodiment of the invention, the storage capacitor $C_{ST}$ may be omitted when the storage capacitor $C_{ST}$ is not needed.

The LC capacitor $C_{LC}$ includes a pixel electrode 190 on the lower panel 100, a common electrode 270 on the upper panel 200, and the LC layer 3 as a dielectric between the pixel electrode 190 and the common electrode 270. The pixel electrode 190 is connected with the switching element Q, and the common electrode 270 covers the entire surface of the upper panel 200 and is supplied with a common voltage Vcom. Alternatively, both the pixel electrode 190 and the common electrode 270, which have shapes of bars or stripes, are provided on the lower panel 100.

The storage capacitor $C_{ST}$ is an auxiliary or supplementary capacitor for the LC capacitor $C_{LC}$. The storage capacitor $C_{ST}$ includes the pixel electrode 190 and a separate signal line (not shown), which is provided on the lower panel 100 and overlaps the pixel electrode 190 with an insulator provided between the pixel electrode 190 and the separate signal line. The storage capacitor $C_{ST}$ is supplied with a predetermined voltage, such as the common voltage Vcom. Alternatively, the storage capacitor $C_{ST}$ may include the pixel electrode 190 and an adjacent gate line referred to as a previous gate line, which overlaps the pixel electrode 190 with an insulator disposed between the pixel electrode 190 and the previous gate line.

For a color display, for example, each pixel may uniquely represents one of three primary colors, such as red, green, and blue colors (spatial division), or sequentially represents the three primary colors in time (temporal division), thereby obtaining a desired color. FIG. 2 shows an example of the spatial division in which each pixel includes a color filter 230 representing one of the three primary colors in an area of the upper panel 200 facing the pixel electrode 190. Alternatively, the color filter 230 is provided on or under the pixel electrode 190 on the lower panel 100.

A pair of polarizers (not shown) for polarizing light are attached on outer surfaces of the lower and upper panels 100 and 200 of the panel assembly 300.

Referring again to FIG. 1, a gray voltage generator 800 generates at least one set of gray voltages related to transmittance of the pixels. For example, when two sets of the gray voltages are generated, the gray voltages in one of the sets have a positive polarity with respect to the common voltage Vcom and the gray voltages in the other of the sets have a negative polarity with respect to the common voltage Vcom.

The gate driver 400 may be integrated or included on the panel assembly 300 and the gate driver 400 synthesizes the gate-on voltage $V_{on}$ and the gate-off voltage $V_{off}$ to generate gate signals for application to the gate lines $G_1$-$G_n$. The gate driver is a shift register, is which includes a plurality of stages in a line.

The data driver 500 is connected with the data lines $D_1$-$D_m$ of the panel assembly 300 and applies data voltages selected from the gray voltages supplied from the gray voltage generator 800 to the data lines $D_1$-$D_m$.

The signal controller 600 controls the gate driver 400 and the data driver 500.

Operation of the display device is described below.

According to an embodiment of the invention, the signal controller 600 is supplied with image signals R, G, and B and input control signals controlling the display of the image signals R, G, and B. The input control signals are received from an external graphics controller (not shown) and include, for example, a vertical synchronization signal Vsync, a horizontal synchronization signal Hsync, a main clock MCLK, and a data enable signal DE. After generating gate control signals CONT1 and data control signals CONT2 and processing the image signals R, G, and B to be suitable for the operation of the panel assembly 300 in response to the input control signals, the signal controller 600 provides the gate control signals CONT1 to the gate drivers 400L and 400R, and the processed image signals DAT and the data control signals CONT2 to the data driver 500.

The gate control signals CONT1 include a vertical synchronization start signal STV informing the gate driver of a start of a frame, a gate clock signal CPV controlling an output time of the gate-on voltage $V_{on}$, and an output enable signal OE defining a width of the gate-on voltage $V_{on}$.

The data control signals CONT2 include a horizontal synchronization start signal STH informing the data driver 500 of a start of a horizontal period, a load signal LOAD or TP instructing the data driver 500 to apply the appropriate data voltages to the data lines $D_1$-$D_m$, and a data clock signal HCLK. The data control signals CONT2 may further include an inversion control signal RVS reversing the polarity of the data voltages, e.g., with respect to the common voltage Vcom.

The data driver 500 receives the processed image signals DAT for a pixel row from the signal controller 600 and converts the processed image signals DAT into analog data voltages selected from the gray voltages supplied from the gray voltage generator 800 in response to the data control signals CONT2 from the signal controller 600.

In response to the gate control signals CONT1 from the signal controller 600, the gate driver 400 applies the gate-on voltage $V_{on}$ to the gate lines $G_1$-$G_n$, thereby turning on the switching elements Q connected with the gate lines $G_1$-$G_n$.

The data driver 500 applies the data voltages to corresponding data lines $D_1$-$D_m$ for a turn-on time of the switching elements Q, which is referred to as "one horizontal period" or "1H" and is one period of the horizontal synchronization signal Hsync, the data enable signal DE, and the gate clock signal CPV. The data voltages are supplied to corresponding pixels via the turned-on switching elements Q.

The difference between the data voltage and the common voltage Vcom applied to a pixel is expressed as a charged voltage of the LC capacitor $C_{LC}$, i.e., a pixel voltage. The liquid crystal molecules have orientations depending on a magnitude of the pixel voltage, and the orientations determine a polarization of light passing through the LC capacitor $C_{LC}$. The polarizers convert light polarization into light transmittance.

By repeating the above-described procedure, all gate lines $G_1$-$G_n$ are sequentially supplied with the gate-on voltage $V_{on}$ during a frame, thereby applying the data voltages to all pixels. For example, with regard to the LCD shown in FIG. 1, when a next frame starts after finishing one frame, the inversion control signal RVS applied to the data driver 500 is controlled such that a polarity of the data voltages is reversed ("frame inversion"). The inversion control signal RVS may be controlled such that the polarity of the data voltages flowing in a data line in one frame is reversed (e.g.: "row inversion", "dot inversion"), or the polarity of the data voltages in one packet is reversed (e.g.: "column inversion", "dot inversion").

A gate driver of a display device according to an embodiment of the invention is described below with reference to FIGS. 3, 4, 5, and 6.

Figure 3:
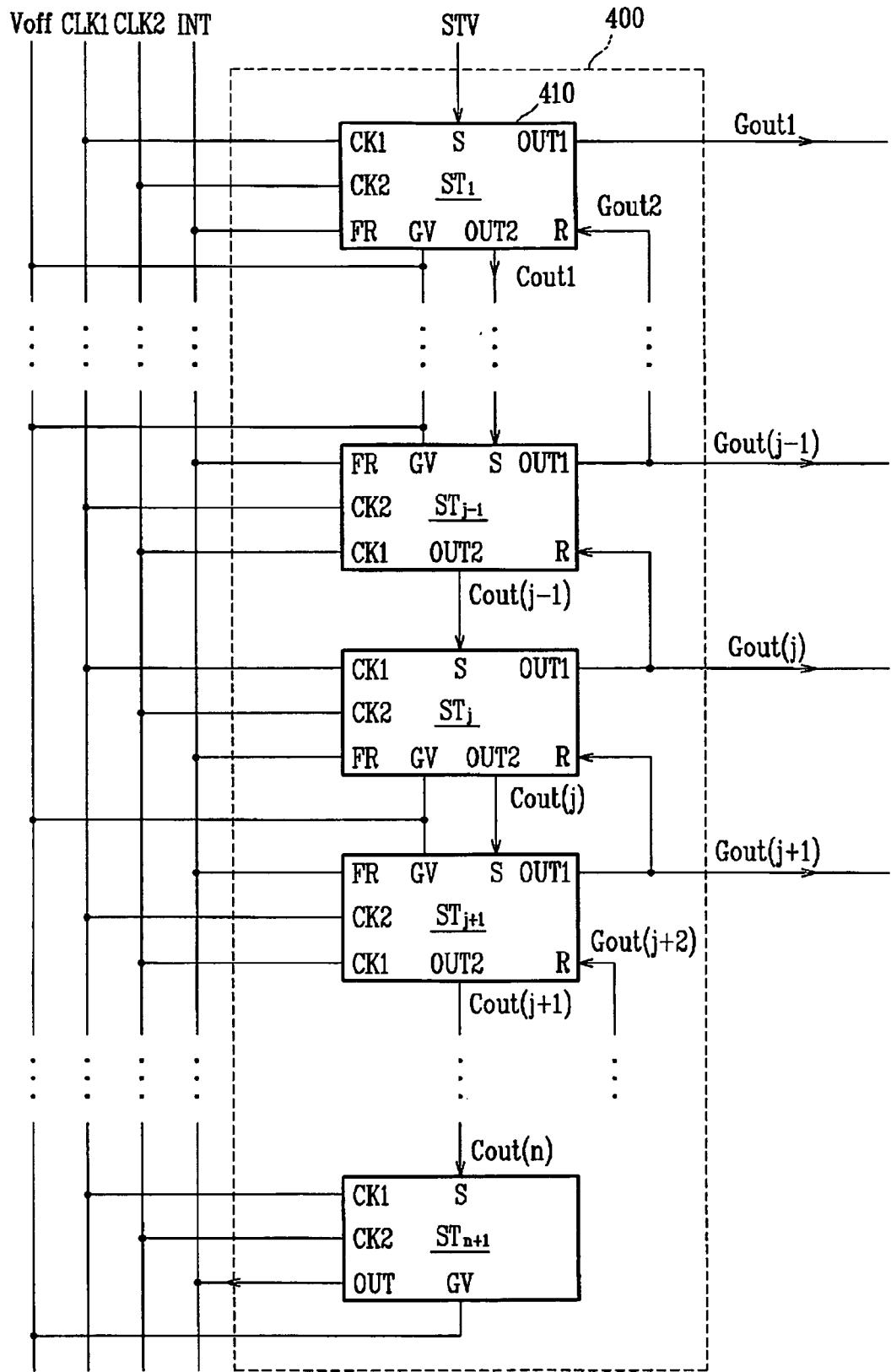
FIG. 3 is a block diagram of a gate driver according to an embodiment of the invention.
Figure 4:
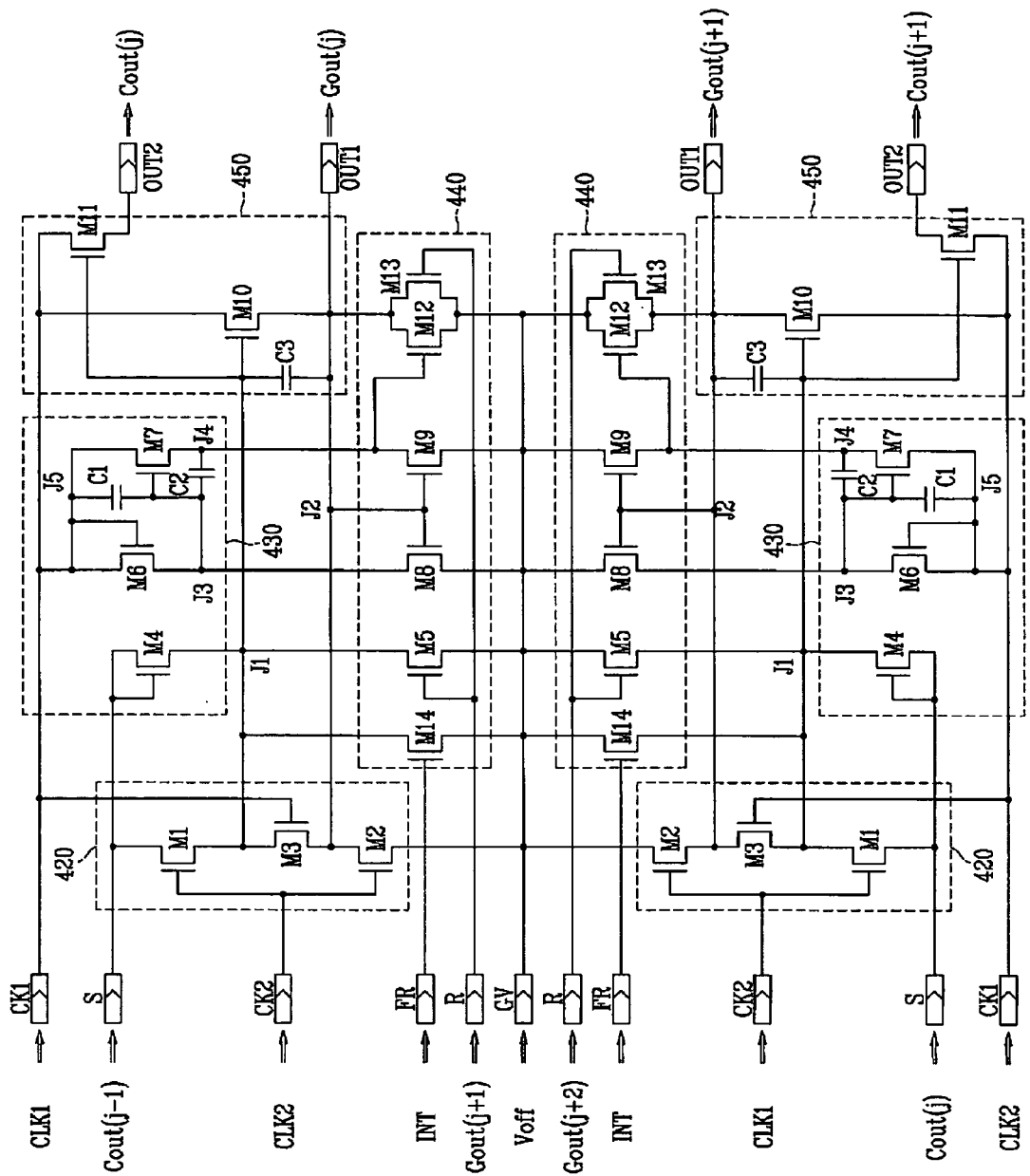
FIG. 4 is an circuit diagram of a j-th stage and a (j+1)-th stage of a shift register for the gate driver shown in FIG. 3.
Figure 5:
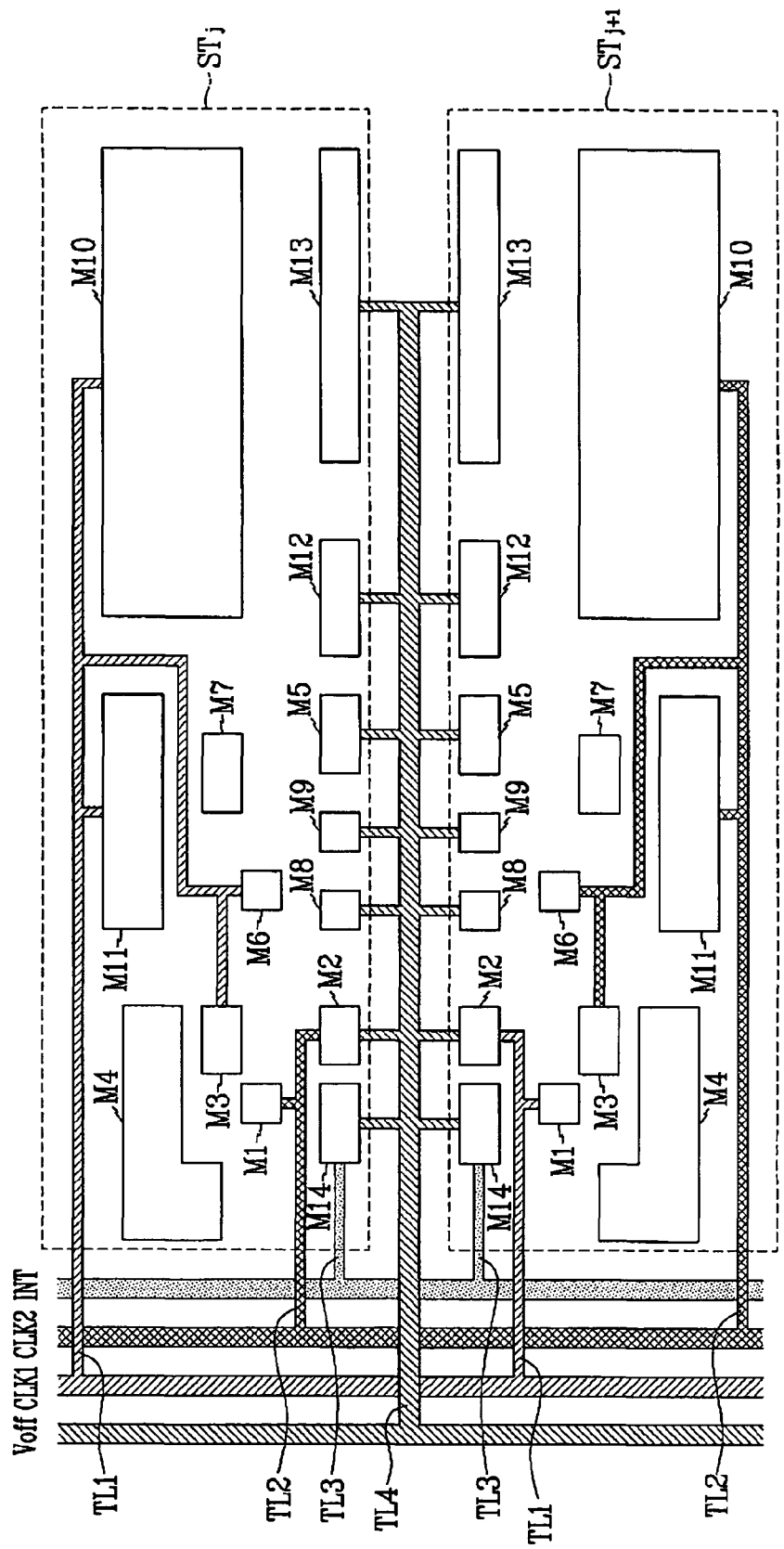
FIG. 5 is a schematic view of the j-th stage and the (j+1)-th stage shown in FIG. 4.
Figure 6:
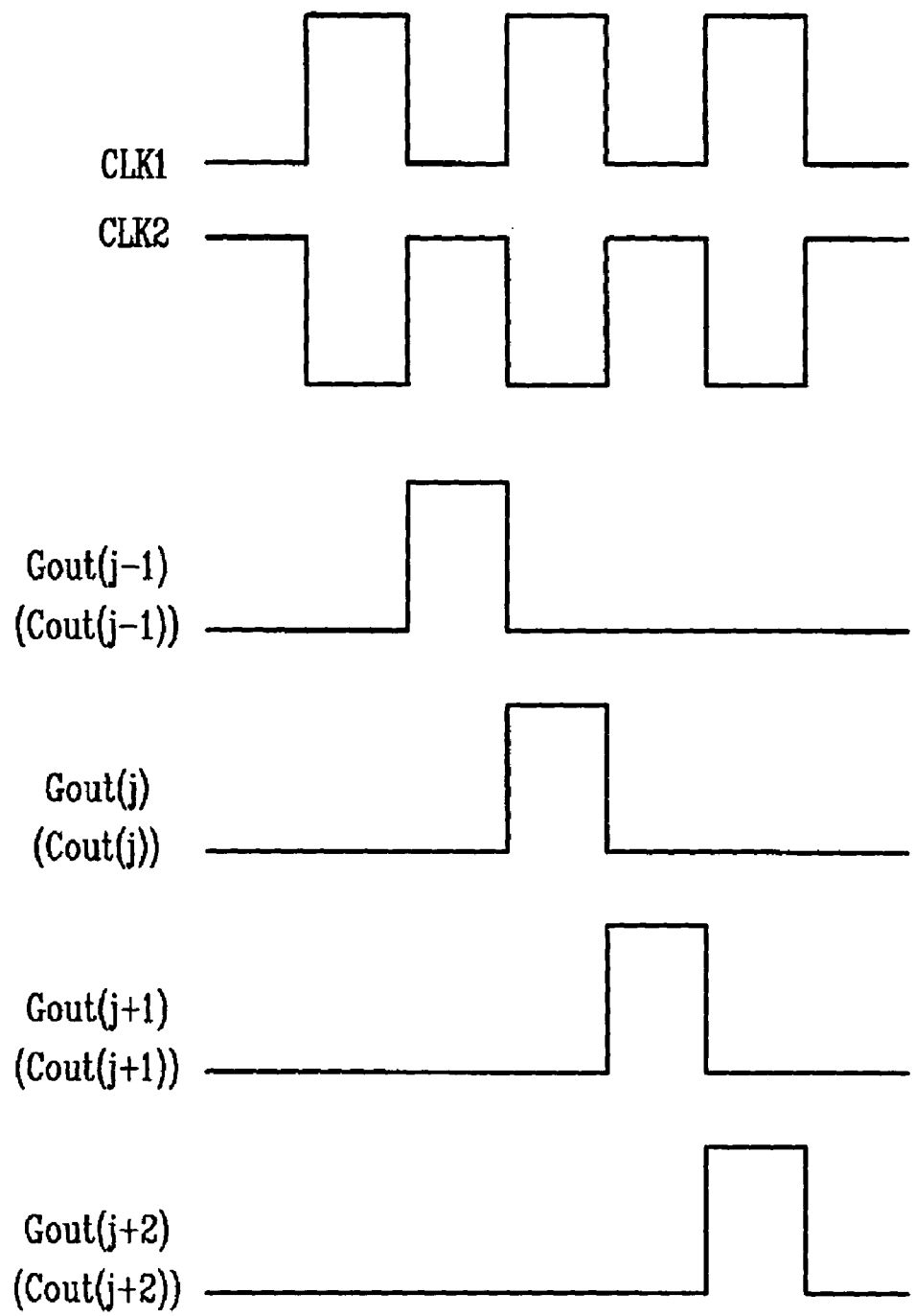
FIG. 6 shows signal waveforms of the gate driver shown in FIG. 3.

FIG. 3 is a block diagram of a gate driver according to an embodiment of the invention. FIG. 4 is an exemplary circuit diagram of a j-th stage and a (j+1)-th stage of a shift register for the gate driver shown in FIG. 3. FIG. 5 is a schematic view of the j-th stage and the (j+1)-th stage shown in FIG. 4. FIG. 6 shows waveforms of signals of the gate driver shown in FIG. 3.

Referring to FIG. 3, a gate driver 400 is a shift register including a plurality of stages 410 arranged in a line and connected with the gate lines $G_1$-$G_n$. The gate driver 400 is applied with a gate-off voltage $V_{off}$, clock signals CLK1 and CLK2, and an initializing signal INT.

The signal and signal lines transmitting the signal use the same reference numeral.

As shown in FIG. 5, signal lines transmitting the above-described signals $V_{off}$, CLK1, CLK2, and INT extend in a substantially longitudinal direction in the panel assembly 300, and they become closer to the shift register 400, where they are provided sequentially in an order of a gate-off voltage line $V_{off}$, clock signal lines CLK1 and CLK2, and an initializing signal line INT from left to right. As shown in FIG. 5, terminal lines TL1-TL4 connecting the signal lines to each of the stages 410 extend in a substantially transverse direction. The terminal line TL4 is connected with the gate-off voltage line $V_{off}$ and extend between two of the stages 410.

Each of the stages 410 includes a set terminal S, a gate-off voltage terminal GV, a pair of clock terminals CK1 and CK2, a reset terminal R, a gate output terminal OUT1, and a carry output terminal OUT2. A portion of the terminals between the two stages 410 is symmetrical above and below. Further, the gate-off voltage terminals GV connected with the gate-off voltage line $V_{off}$ are arranged adjacent to each other in a substantially symmetrical position with respect to the terminal line TL4.

In each of the stages 410, for example, the set terminal S of the j-th stage $ST_j$, is supplied with a carry output of a previous stage $ST_{j-1}$, i.e., a previous carry output, and the reset terminal thereof is supplied with a gate output of a next stage $ST_{j+1}$, i.e., a next gate output Gout(j+1). The clock terminals CK1 and CK2 thereof receive the clock signals CLK1 and CLK2, respectively, the gate voltage terminal GV receives the gate-off voltage $V_{off}$, and the frame reset terminal FR receives the initializing signal INT. The gate output terminal OUT1 outputs a gate output Gout(j) and the carry output terminal OUT2 outputs a carry output Cout(j).

However, the S terminal of an initial stage STI of the left shift register 400 is supplied with the vertical synchronization start signal STV instead of the previous gate output. When the clock terminals CK1 and CK2 of the j-th stage receive the clock signal CLK1 and to CLK2, respectively, the clock terminals CK1 of the (j-1)-th stage $ST_{j-1}$ and the (j+1)-th stage $ST_{j+1}$ receive the clock signal CLK2 and the clock terminals CK2 thereof receive the clock signal CLK1.

Each clock signal CLK1 and CLK2 may be the gate-on voltage $V_{on}$ for a high interval and is the gate-off voltage for a low interval, respectively, to drive the switching elements Q of the pixels. As shown in FIG. 6, the duty ratio and the phase difference of the clock signals CLK1 and CLK2 may be 50% and 180 degrees, respectively.

Referring to FIG. 4, each, of the stages 410 of the gate driver 400, for example the j-th stage $ST_j$, may include an input unit 420, a pull-up driving unit 430, a pull-down driving unit 440, and an output unit 450. Each of the above-described units 420, 430, 440, and 450 may include an NMOS transistor, for example, M1-M13, which acts as an electrical conduction path between a drain and a source of each transistor controlled by an input at a gate of each transistor. The pull-up driving unit 430 and the output unit 450 may further include capacitors C1-C3. It is understood that the NMOS transistors may be replaced by PMOS transistors. Further, the capacitors C1-C3 may be parasitic capacitances between a gate and either a drain or a source formed during a manufacturing process.

The input unit 420 may include three transistors M1, M3, and M2 connected in series sequentially between the set terminal S and the gate voltage terminal GV. Gates of the transistors M1 and M3 are connected with the clock terminal CK2, and gate of the transistor M2 is connected with the clock terminal CK1. A point of contact between the transistor M1 and the transistor M3 is connected with a contact J1, and a point of contact between the transistor M3 and the transistor M1 is connected with a contact J2.

The pull-up driving unit 430 includes a transistor M4 connected between the set terminal S and the contact J1, a transistor M6 connected between the clock terminal CK1 and a contact J3, and a transistor M7 connected between the clock terminal CK1 and a contact J4. The transistor M4 includes a gate and a drain commonly connected with the set terminal S and a source connected with the contact J1, and the transistor M6 includes a gate and a drain commonly connected with the clock terminal CK1 and a source connected with the contact J3. The transistor M7 has a gate connected with the contact J3 the clock terminal CK1 via the capacitor C1, and a drain connected with the clock terminal CK1 and a source that is connected with the contact J4. The capacitor C2 is connected between the contact J3 and the contact J4.

The pull-down driving unit 440 includes transistors M5, M8, M9, M10, M11, and M12 applied with the gate-off voltage $V_{off}$ via sources thereof for output to the contacts J1-J4. A gate and a drain of the transistor M5 are connected with the reset terminal R and the contact J1, respectively.

Gates of the transistors M8 and M9 may be connected with the contact J2 and drains thereof are commonly connected with the contacts J3 and J4, respectively. A gate of the transistor M12 is connected with the contact J4, and a gate of the transistor M13 is connected with the reset terminal R. Drains of the transistors M12 and M13 may be connected with the contact J2. A gate, a drain, and a source of the transistor M14 are connected with the frame reset terminal FR, the contact J1, and the gate voltage terminal GV, respectively.

The output unit 450 includes transistors M10 and M11 and the capacitor C3. Drains and gates of the transistors M10 and M11 are connected with the clock terminal CK1 and the output terminals OUT1 and OUT2, and gates thereof are connected with the contact J1. The capacitor C3 is connected between the gate and the drain of the transistor M10, i.e., the contact J1 and the contact J2. The source of the transistor M10 is also connected with the contact J2.

According to the above described arrangement of the respective transistors, the gate-off voltage line $V_{off}$, the first and second clock signal lines CLK1 and CLK2, and the initializing signal line INT are arranged in a substantially longitudinal direction and arranged in an order such that they are respectively nearer to the stages $ST_j$ and $ST_{j+1}$, as shown in FIG. 5. For example, the gate-off voltage line $V_{off}$ is located furthest from the stages $ST_j$ and $ST_{j+1}$ and the initializing signal line INT is located nearest to the stages $ST_j$ and $ST_{j+1}$. Further, the terminal lines TL1-TL4 connected with the signal lines $V_{off}$, CLK1, CLK2, and INT extend in substantially a transverse direction.

Further, in the j-th stage $ST_j$, the transistor M4, which is applied with the previous carry signal Cout(j−1), is provided at the top-left portion of the stage $ST_j$, near the previous stage $ST_{j-1}$, and the transistors M10 and M11 are provided along the terminal line TL1, which is connected with the clock signal line CLK1, extending in a transverse direction at the top of the stage $ST_j$, and the transistors M3, M6, and M7 are provided below the transistor M11.

Further, the transistors M1 and M2 are provided at a portion of the left side of the stage $ST_j$, and are connected with the terminal line TL2 entering at the left side of the stage $ST_j$ to receive the clock signal CLK2. The transistor M14 is also provided at a portion of the left side of the stage $ST_j$, and is connected with the terminal line TL3 connected with the initializing signal line TL3, to receive the initializing signal INT. The transistors M5, M8, M9, M12, and M13 are provided along the terminal line TL4, which is connected with the gate-off voltage line $V_{off}$, extending in a substantially transverse direction at a portion of the bottom side of the stage $ST_j$.

According to the above described embodiment of the invention, the transistors of the (j+1)-th stage $ST_{j+1}$ are provided substantially symmetrical to the j-th stage $ST_j$ with respect to the terminal line TL4. In particular, the transistors M14, M2, M8, M9, M5, M12, and M13 of the (j+1)-th stage $ST_{j+1}$ and the j-th stage $ST_j$ may be connected with the terminal line TL4. However, unlike the j-th stage $ST_j$, the terminal line TL1 connected with the clock signal line CLK1 enters at the left side of the stage $ST_{j+1}$ and the terminal line TL2 connected with the clock signal line CLK2 extends in a substantially transverse direction at a portion of the bottom side of the stage $ST_{j+1}$.

An operation of a stage, for example the j-th stage $ST_j$, is described below with reference to FIGS. 4, 5, and 6.

For purposes of convenience, a voltage corresponding with the high levels of the clock signals CLK1 and CLK2 is referred to as a high voltage, and a voltage corresponding with the low levels thereof, which is the same as the magnitude of the gate-off voltage $V_{off}$, is referred to as a low voltage.

When the clock signal CLK2 and the previous gate output signal Gout(j−1) are higher than a predetermined level, the transistors M1, M2, and M4 turn on. Two transistors M1 and M4 transmit the high voltage to the contact J1, and the transistor M2 transmits the low voltage to the contact J2. Thus, the transistors M10 and M11 turn on and the clock signal CLK1 is transmitted to the output terminals OUT1 and OUT2. Since a voltage at the contact J2 and the clock signal CLK1 are low, the output voltages Gout(j) and Cout(j) are also low. When the transistors M10 and M11 are turned on and the clock signal CLK1 is transmitted to the output terminals OUT1 and OUT2, the capacitor C3 charges a voltage of a magnitude corresponding to a difference between the high voltage and the low voltage.

Therefore, when the clock signal CLK1 and the next gate output Gout(j+1) are low and a voltage at the contact J2 is also low, the transistors M3, M5, M6, M8, M9, and M13, which have the gates connected thereto, are turned off.

Subsequently, when the clock signal CLK2 becomes low, the transistors M1 and M2 are turned off, and when the clock signal CLK1 becomes high, an output voltage of the transistor M10 and a voltage at the contact J2 become the high voltage. For example, when the high voltage is applied to the gate of the transistor M3, the source voltage thereof connected with the contact J2 is also the high voltage; therefore, a voltage difference becomes 0 and the transistor M3 remains turned off. Accordingly, the contact J1 is in a floating state and a voltage of the contact J1 increases proportionally, e.g., as much as, with the high voltage by the capacitor C3.

However, since the clock signal CLK1 and the contact J2 are the high voltage, the transistors M6, M8, and M9 are turned off. Therefore, the transistor M6 and the transistor M8 are connected in series between the high and the low voltages. Thus, a voltage at the contact J3 becomes a voltage value divided by resistances in ohmic states at the turned-on time of two transistors M6 and M8.

When the resistance in the ohmic state at the turned-on time of the transistor M8 is set to be much larger, e.g., 10,000 times that of the transistor M6, a voltage at the contact J3 is substantially identical to the high voltage. Accordingly, the transistor M7 is turned on to be connected in series with the transistor M9, and thereby a voltage at the contact J4 becomes a voltage value divided by resistances in ohmic states at the turned-on time of two transistors M7 and M9.

When the resistances in the ohmic state at the turned-on time of two transistors M7 and M9 are set to be substantially identical to each other, the voltage at the contact J4 becomes a middle value of the high and the low voltages. Since the next gate output Gout(j+1) remains low, the transistors M5 and M13 are turned off. Accordingly, the output terminals OUT1 and OUT2 are only connected with the clock signal CLK1 only and they are disconnected from the low voltage to output the high voltage.

Additionally, the capacitors C1 and C2 charge voltages corresponding to voltage differences developed at both terminals, respectively, and a voltage at the contact J3 is lower than that a voltage at a contact J5.

Subsequently, when the next gate output Gout(j+1) and the clock signal CLK2 become low and the clock signal CLK1 becomes high, the transistors M5 and M13 are turned on to transmit the low voltage to the contacts J1 and J2. At this time, a voltage at the contact J1 decreases to the low voltage while the capacitor C3 discharges, and a certain amount of time is needed until the voltage at the contact J1 becomes the complete low voltage. Accordingly, two transistors M10 and M11 are turned on for a while after the next gate output Gout(j+1) voltage becomes high, and thereby the output terminals OUT1 and OUT2 are connected with the clock signal CLK1 to output the low voltage. When the voltage at the contact J1 reaches the low voltage due to complete discharge of the capacitor C3, the transistor M11 is turned off to disconnect the output terminal OUT2 from the clock signal CLK1, and the carry output Cout(j) is in a floating state and the voltage remains low. However, since the output terminal OUT1 is connected with the low voltage via the transistor M13 irrespective of turned-off state of the transistor M10, low voltage is output.

When the transistors M6 and M8 are turned off, the contact J3 is in a floating state. Additionally, since a voltage at the contact J5 is lower than a voltage at the contact J4, and since the voltage at the contact J3 remains lower than the voltage at the contact J5 because of the capacitor Cl, the transistor M7 is turned off. Simultaneously, the transistor M9 is turned off and the voltage at the contact J4 decreases as much as that, and thus the transistor M12 remains turned off. Additionally, the transistor M3 is connected with the low voltage of the gate clock signal CLK1 and the voltage at the contact J2 is low, and thus the transistor M3 remains turned off.

Since the transistors M6 and M7 are turned on due to the high voltage of the clock signal CLK1 and the increase of the voltage at the contact J4 turns on the transistor M12 so that the low voltage is transmitted to the contact J2, the output terminal OUT1 continuously outputs the low voltage. That is, even though the voltage of the next gate output Gout(j+1) is low, the voltage at the contact J2 is made to be the low voltage.

Additionally, the gate of the transistor M3 is connected with the high voltage of the clock signal CLK1 and the voltage at the contact J2 is the low voltage, and thus the transistor M3 is turned on to transmit the voltage at the contact J2 to the contact J1. On the other hand, the drains of two transistors M10 and M11 are connected with the clock terminal CK1 to be continuously applied with the clock signal CLK1.

In particular, the transistor M10 has a larger size than the remaining transistors, and thereby a parasitic capacitance between the gate and the drain thereof is sufficiently large such that voltage variation of the drain may affect a gate voltage. Accordingly, an increase of the gate voltage due to the parasitic capacitance between the gate and the drain of the transistor M10 on the high voltage of the clock signal CLK1 turns on the transistor M10. In this case, such voltage prevents the transistor M10 from turning on such that the gate voltage of the transistor M10 maintains the low voltage by transmitting the low voltage at the contact J2 to the contact J1.

The voltage at the contact J1 maintains the low voltage until the voltage of the previous carry output Cout(j−1) becomes high. The voltage at the contact J2 is the low voltage via the transistor M12 when the clock signal CLK1 is high and the clock signal CLK2 is low. The voltage at the contact J2 is the low voltage via the transistor M2 when the clock signal CLK1 is low and the clock signal CLK2 is high.

In addition, the transistor M14 is supplied with the initializing signal INT output from the last dummy stage STn+1 to transmit the gate-off voltage $V_{off}$ to the contact J1, thereby setting the voltage at the contact J1 to be the low voltage again.

Each stage 410 generates the carry signal Cout(j) and the gate output Gout(j) synchronized with the clock signals CLK1 and CLK2 according to the previous carry signal Cout (j−1) and the subsequent gate output Gout(j+1).

Further, two stages share one terminal line TL4 connected with a gate off voltage line $V_{off}$, thereby decreasing an area occupied with the stages. Thus, transistors related to the output, for example, the transistor M10, are larger by as much as the decreased area, thereby increasing the magnitude of the output to provide a gate driver capable of driving a display device with high resolution and a display on a large-sized screen.

As shown in FIG. 3, the terminal line TL4 is connected with the gate-off voltage line $V_{off}$ and intersects the clock signal lines CLK1 and CLK2 and the initializing signal line INT. Thus, two stages share the terminal line TL4, which decreases the intersection points by half, thereby decreasing a parasitic capacitance caused by the intersection to reduce power consumption.

Accordingly, an area occupied with the gate driver may be decreased by sharing the terminal line TL4, and thereby providing a display device capable of implementing high resolution and large-sized screen and reducing power consumption.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
pixels, each comprising a switching element;
a shift register comprising adjacent stages coupled with the switching elements and sequentially generating output signals;
a clock signal line transmitting a clock signal;
at least one control signal line transmitting a control signal; and
a terminal line connecting the clock signal line or the control signal line with the adjacent stages,
wherein the terminal line comprises at least one common terminal line; and
wherein the common terminal line is connected to two of the adjacent stages along a border of the stages, the border being between the two of the adjacent stages.

2. The display device of claim 1, wherein the common terminal line is connected with a signal line that is located farthest from the stages from among the clock signal line and the control signal line.

3. The display device of claim 1, wherein the shift register is formed with the switching elements.

4. The display device of claim 1, wherein each of said two of the adjacent stages includes input terminals which receive the clock signal and the control signal and wherein at least one input terminal belonging to a first stage of said two of the adjacent stages substantially disposed symmetrically with at least one input terminal belonging to a second of said two of the adjacent stages along the border of the stages, the border being between the two adjacent stages.

5. The display device of claim 4, wherein the two input terminals belonging to the two adjacent stages receive one of the clock signal and the control signal via the same common terminal line.

6. The display device of claim 1, wherein the two of the adjacent stages are substantially disposed symmetrically along the border of the stages, the border being between the two of the adjacent stages.

7. The display device of claim 1, wherein the common terminal line is connected to a gate-off voltage line.

8. The display device of claim 7, wherein each of the stages comprises a plurality of first transistors connected to the common terminal line, the first transistors are disposed adjacent to the common terminal line.

9. The display device of claim 8, at least one of the first transistors of a first stage of the two of the adjacent stages is symmetrical with a corresponding one of the first transistors of a second stage of the two of the adjacent stages along the border of the two of the adjacent stages.

10. The display device of claim 7, wherein each of the stages comprises a plurality of first transistors connected to the common terminal line, at least one of the first transistors of a first stage of the two of the adjacent stages is symmetrical with a corresponding one of the first transistors of a second stage of the two of the adjacent stages along the border of the two of the adjacent stages.

11. The display device of claim 1, wherein each of the stages comprises a plurality of first transistors connected to the common terminal line, the first transistors are disposed adjacent to the common terminal line.

12. The display device of claim 11, at least one of the first transistors of a first stage of the two of the adjacent stages is symmetrical with a corresponding one of the first transistors of a second stage of the two of the adjacent stages along the border of the two of the adjacent stages.

13. The display device of claim 1, wherein each of the stages comprises a plurality of first transistors connected to the common terminal line, at least one of the first transistors of a first stage of the two of the adjacent stages is symmetrical with a corresponding one of the first transistors of a second stage of the two of the adjacent stages along the border of the two of the adjacent stages.

14. The display device of claim 2, wherein each of the stages comprises a plurality of first transistors connected to the common terminal line, the first transistors are disposed adjacent to the common terminal line.

15. The display device of claim 14, at least one of the first transistors of a first stage of the two of the adjacent stages is symmetrical with a corresponding one of the first transistors of a second stage of the two of the adjacent stages along the border of the two of the adjacent stages.

16. The display device of claim 2, wherein each of the stages comprises a plurality of first transistors connected to the common terminal line, at least one of the first transistors of a first stage of the two of the adjacent stages is symmetrical with a corresponding one of the first transistors of a second stage of the two of the adjacent stages along the border of the two of the adjacent stages.

17. The display device of claim 2, wherein the control signal line comprises: a gate-off voltage line transmitting a gate-off voltage to turn off the switching element.

18. The display device of claim 17, wherein the control signal line further comprises: an initializing signal line to initialize the stages.

19. The display device of claim 18, wherein the initializing signal line is located closest to the stages from among the clock signal line and the control signal line.

20. The display device of claim 19, wherein the shift register further comprise:
a dummy stage generating the initializing signal.

21. The display device of claim 20, wherein the terminal line comprises:
a first terminal line connected with a signal line transmitting one of the first clock signal and the second clock signal;
a second terminal line connected with a signal line transmitting the other of the first clock signal and the second clock signal;
a third terminal line connected with the initializing signal line; and
a fourth terminal line connected with the gate-off voltage line.

22. The display device of claim 21, wherein each of the stages comprises:
a plurality of transistors; and
a plurality of first transistors receiving the gate-off voltage, wherein the first transistors are provided nearer the fourth terminal line than to any of the first terminal line, the second terminal line, and the third terminal line.

23. The display device of claim 22, wherein the first transistors belonging to a first stage of the adjacent stages are substantially symmetrical with the first transistors belonging to second stage of the adjacent stages.

24. The display device of claim 23, wherein each of the stages comprises:
a driving unit charging a predetermined voltage in response to a scanning start signal or an output signal from one of previous stages; and
a discharge unit discharging the charged voltage according to an output signal from one of sequent stages.

25. The display device of claim 18, wherein the clock signal line comprises a first clock signal line transmitting a first clock signal and a second clock signal line transmitting a second clock signal, and a phase of the second clock signal is different from a phase of the first second clock signal.

26. The display device of claim 17, wherein the signal line located farthest from the stages is the gate-off voltage line.

27. The display device of claim 26, wherein each of the stages comprises a plurality of first transistors connected to the common terminal line, the first transistors are disposed adjacent to the common terminal line.

28. The display device of claim 27, at least one of the first transistors of a first stage of the two of the adjacent stages is symmetrical with a corresponding one of the first transistors of a second stage of the two of the adjacent stages along the border of the two of the adjacent stages.

29. The display device of claim 27, wherein each of the stages comprises a plurality of first transistors connected to the common terminal line, at least one of the first transistors of a first stage of the two of the adjacent stages is symmetrical with a corresponding one of the first transistors of a second stage of the two of the adjacent stages along the border of the two of the adjacent stages.

30. The display device of claim 8 wherein each of the stages comprises:
a first switching element connected with the second terminal line;
a second switching element connected with the second and the fourth terminal lines;
a third, a fourth, a fifth, a sixth, and a seventh switching element, each connected with the first terminal line;
an eighth switching element receiving an output of a previous stage;
a ninth switching element connected with the third terminal line and the fourth terminal line; and
a tenth, an eleventh, a twelfth, a thirteenth, and a fourteenth switching element, each connected with the fourth terminal line,
wherein the twelfth switching element receives an output of a subsequent stage.

31. The display device of claim 30, wherein the first switching element through the fourteenth switching element comprise amorphous silicon.

32. The display device of claim 31, wherein the shift register is integrated on the display device.

33. A display device comprising:
a shift register comprising stages connected with each other, each of the stages sequentially generating output signals, wherein each of the stages comprises:
a set terminal applied with a scanning start signal or an output signal from any one of previous stages;
a reset terminal applied with an output signal received from any one of subsequent stages;
a first clock terminal and a second clock terminal applied with a first clock signal and a second clock signal, respectively;
a gate voltage terminal applied with a gate-off voltage; and
at least one output terminal,
wherein corresponding gate voltage terminals belonging to two adjacent stages of the stages are substantially disposed symmetrically along a border of the stages, the border being between the two adjacent stages.

34. The display device of claim 33, wherein a phase of the first clock signal is opposite to a phase of the second clock signal.

35. The display device of claim 33, wherein said any one of previous stage is adjacent to said each stage, and any said one of subsequent stages is adjacent to said each stage.

36. The display device of claim 33, wherein said each of the stages further comprises: a frame reset terminal applied by an initializing signal.

37. The display device of claim 36, wherein said each of the stages comprises:
a driving unit charging a predetermined voltage in response to the scanning start signal or an output signal from any one of previous stages and generating the output signal in response to any one of the clock signals; and
a discharge unit discharging the charged voltage in response to the output signal received from said any one of the subsequent stages.

38. The display device of claim 37, wherein the driving unit comprises:
a first switching element, a second switching element, and a third switching element connected in series between the set terminal and the gate voltage terminal;
a fourth switching element connected between the set terminal and a first contact;
a fifth switching element connected between the first clock terminal and a second contact;
a sixth switching element connected between the first clock terminal and a third contact;
a seventh switching element connected between the first clock terminal and a fourth contact;
an eighth switching element connected to the first clock terminal;
a first capacitor connected between the first clock terminal and the second contact;
a second capacitor connected between the second contact and the third contact;
and a third capacitor connected between the first contact and the fourth contact,
wherein control terminals of the first and second switching elements are connected with the second clock terminal, a control terminal of the third switching element is connected with the first clock terminal, a control terminal of the fourth switching element is connected with the set terminal, a control terminal of the fifth switching element is connected with the first clock terminal, a control signal of the sixth switching element is connected with the second clock terminal, and control signals of the seventh and eighth switching elements are connected with the first contact, and wherein the discharge unit comprises:
a ninth and a tenth switching element connected between the first contact and the gate voltage terminal,
an eleventh terminal connected between the second contact and the gate voltage terminal,
a twelfth switching element connected between the gate voltage terminal and the third contact, and
a thirteenth switching element and a fourteenth switching element connected in parallel between the fourth contact and the gate voltage terminal,
wherein a control terminal of the ninth switching element is connected with the frame reset terminal, a control signal of the tenth switching element is the reset terminal, control signals of the eleventh switching element and the twelfth switching element are connected with the fourth contact, a control terminal of the thirteenth switching element is connected with the third contact, and a control terminal of the fourteenth switching element is connected with the reset terminal, and
wherein the first output terminal is connected with the fourth contact, and the second output terminal is connected with an output terminal of the eighth transistor.

39. The display device of claim 38, wherein the first switching element through the fourteenth switching element comprise amorphous silicon.

40. The display device of claim 39, wherein the shift register is integrated on the display device.

41. A display device comprising:
pixels, each comprising a switching element;
a shift register comprising adjacent stages coupled with the switching elements and sequentially generating output signals;
clock signal lines transmitting clock signals;
at least one control signal line transmitting a control signal,
wherein the stage include input terminals which receives one of the clock signals and control signal and wherein at least one input terminal belonging to a first stage of the adjacent stages disposed substantially symmetrical with at least one input terminal belonging to second stage of the adjacent stages along a border of the stages, the border being between the two adjacent stages, and wherein the two input terminals belonging to the two adjacent stages are electrically connected to the same clock signal line or to the same control signal line.

42. A display device comprising:
pixels, each comprising a switching element;
a shift register comprising adjacent stages coupled with the switching elements and sequentially generating output signals;
wherein at least two adjacent stages are substantially disposed symmetrically along a border of the stages, the border being between two of the adjacent stages.

43. A display device comprising:
pixels, each comprising a switching element;
a gate driver comprising a first stage and a second stage which are adjacent to each other and coupled with corresponding switching elements;
a gate-off voltage line transmitting a gate-off voltage; and
a first terminal line connecting the gate-off voltage line with the first and second stages, wherein the first terminal line is connected to the first and second stages along a border of the first and second stages, the border being between the first stage and the second stage.

44. The display device of claim 43, wherein each of the first and second stages comprises a plurality of first transistors connected to the first terminal line, and the first transistors are disposed adjacent to the first terminal line.

45. The display device of claim 44, at least one of the first transistors of the first stage is symmetrical with a corresponding one of the first transistors of the second stage along the border of the first and second stages.

46. The display device of claim 45, further comprising a second terminal line connected to the gate-off voltage line, wherein the gate driver further comprises a third stage which is adjacent to the first stage, coupled with a corresponding switching element and connected to the second terminal line which is different from the first terminal line.

47. The display device of claim 46, further comprising a third terminal line connected to the gate-off voltage line, wherein the gate driver further comprises a fourth stage which is adjacent to the second stage, coupled with a corresponding switching element and connected to the third terminal line which is different from the first terminal line and the second terminal line.

48. The display device of claim 45, further comprising a third terminal line connected to the gate-off voltage line, wherein the gate driver further comprises a fourth stage which is adjacent to the second stage, coupled with a corresponding switching element and connected to the third terminal line which is different from the first terminal line.

49. The display device of claim 44, further comprising a second terminal line connected to the gate-off voltage line, wherein the gate driver further comprises a third stage which is adjacent to the first stage, coupled with a corresponding switching element and connected to the second terminal line which is different from the first terminal line.

50. The display device of claim 49, further comprising a third terminal line connected to the gate-off voltage line, wherein the gate driver further comprises a fourth stage which is adjacent to the second stage, coupled with a corresponding switching element and connected to the third terminal line which is different from the first terminal line and the second terminal line.

51. The display device of claim 44, further comprising a third terminal line connected to the gate-off voltage line, wherein the gate driver further comprises a fourth stage which is adjacent to the second stage, coupled with a corresponding switching element and connected to the third terminal line which is different from the first terminal line.

52. The display device of claim 43, wherein each of the first and second stages comprises a plurality of first transistors connected to the first terminal line, and at least one of the first transistors of the first stage is symmetrical with a corresponding one of the first transistors of the second stage along the border of the first and second stages.

53. The display device of claim 52, further comprising a second terminal line connected to the gate-off voltage line, wherein the gate driver further comprises a third stage which is adjacent to the first stage, coupled with a corresponding switching element and connected to the second terminal line which is different from the first terminal line.

54. The display device of claim 53, further comprising a third terminal line connected to the gate-off voltage line, wherein the gate driver further comprises a fourth stage which is adjacent to the second stage, coupled with a corresponding switching element and connected to the third terminal line which is different from the first terminal line and the second terminal line.

55. The display device of claim 52, further comprising a third terminal line connected to the gate-off voltage line, wherein the gate driver further comprises a fourth stage which is adjacent to the second stage, coupled with a corresponding switching element and connected to the third terminal line which is different from the first terminal line.

56. The display device of claim 43, further comprising a second terminal line connected to the gate-off voltage line, wherein the gate driver further comprises a third stage which is adjacent to the first stage, coupled with a corresponding switching element and connected to the second terminal line which is different from the first terminal line.

57. The display device of claim 56, further comprising a third terminal line connected to the gate-off voltage line, wherein the gate driver further comprises a fourth stage which is adjacent to the second stage, coupled with a corresponding switching element and connected to the third terminal line which is different from the first terminal line and the second terminal line.

58. The display device of claim 43, further comprising a third terminal line connected to the gate-off voltage line, wherein the gate driver further comprises a fourth stage which is adjacent to the second stage, coupled with a corresponding switching element and connected to the third terminal line which is different from the first terminal line.

* * * * *